US012690193B2

(12) United States Patent
Han

(10) Patent No.: US 12,690,193 B2
(45) Date of Patent: Jul. 21, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventor: Yun Cheol Han, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 361 days.

(21) Appl. No.: 18/473,295

(22) Filed: Sep. 25, 2023

(65) Prior Publication Data

US 2025/0031373 A1 Jan. 23, 2025

(30) Foreign Application Priority Data

Jul. 17, 2023 (KR) ........................ 10-2023-0092448

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |
| *H10W 20/41* | (2026.01) |

(52) U.S. Cl.
CPC ............. *H10B 43/27* (2023.02); *H10B 41/10* (2023.02); *H10B 41/27* (2023.02); *H10B 43/10* (2023.02); *H10W 20/435* (2026.01)

(58) Field of Classification Search
CPC ........ H10B 43/27; H10B 41/27; H10B 41/10; H10B 43/10; H10B 43/50; H10B 41/50; H10B 63/00; H01L 23/5283
See application file for complete search history.

(56) References Cited

U.S. PATENT DOCUMENTS

| | | | | |
|---|---|---|---|---|
| 11,450,685 | B2 | 9/2022 | Yoshida | |
| 2019/0067182 | A1* | 2/2019 | Lee ......................... | H10B 41/10 |
| 2021/0066337 | A1* | 3/2021 | Xia ......................... | H10B 41/27 |
| 2021/0265268 | A1* | 8/2021 | Su .......................... | H10B 43/10 |
| 2022/0366985 | A1* | 11/2022 | Wang ................. | G11C 16/0483 |

FOREIGN PATENT DOCUMENTS

KR 10-2021-0136455 A 11/2021

* cited by examiner

*Primary Examiner* — Moazzam Hossain
(74) *Attorney, Agent, or Firm* — IP&T GROUP LLP

(57) ABSTRACT

A semiconductor device may include: a first gate structure in a first memory block and including stacked first gate lines, the first gate lines extending from a plane center region to a plane edge region; a second gate structure in a second memory block adjacent to the first memory block and including stacked second gate lines, the second gate lines extending from the plane center region to the plane edge region; an isolation insulating structure located a) between the first gate structure and the second gate structure and b) in the plane edge region, the isolation insulating structure including stacked insulating plates and insulating pillars extending through the insulating plates; and a slit structure located a) between the first gate structure and the second gate structure and b) in the plane center region, the slit structure connected to the isolation insulating structure, and including irregularities on a sidewall thereof.

20 Claims, 23 Drawing Sheets

III

III

I

D-D'

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2023-0092448 filed on Jul. 17, 2023, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been considered. Furthermore, in order to improve the operational reliability of such a three-dimensional semiconductor device, various structures and manufacturing methods have been developed.

SUMMARY

In one embodiment, a semiconductor device may include: a first gate structure in a first memory block and including stacked first gate lines, the first gate lines extending from a plane center region to a plane edge region; a second gate structure in a second memory block adjacent to the first memory block and including stacked second gate lines, the second gate lines extending from the plane center region to the plane edge region; an isolation insulating structure located a) between the first gate structure and the second gate structure and b) in the plane edge region, the isolation insulating structure including stacked insulating plates and insulating pillars extending through the insulating plates; and a slit structure located a) between the first gate structure and the second gate structure and b) in the plane center region, the slit structure connected to the isolation insulating structure, and including irregularities on a sidewall thereof.

In another embodiment, a semiconductor device may include: a dummy stack including sacrificial layers and insulating layers that are alternately stacked; a first gate structure adjacent to the dummy stack in a first direction and including stacked first gate lines; a second gate structure adjacent to the dummy stack in the first direction and including stacked second gate lines; first contact structures extending through the first gate structure and connected to the first gate lines, respectively; second contact structures extending through the second gate structure and connected to the second gate lines, respectively; a slit structure extending between the first gate structure and the second gate structure; and an isolation insulating structure connected to the slit structure and extending between the first gate structure and the second gate structure to protrude into the dummy stack.

In still another embodiment, a manufacturing method of a semiconductor device may include: forming a stack including first material layers and second material layers that are alternately stacked; forming first openings in a plane edge region of the stack; forming second openings in a plane center region of the stack; forming an isolation trench by etching the first material layers through the first openings; forming an isolation insulating structure in the isolation trench; forming a slit by expanding the second openings so that the second openings are connected to each other, the slit exposing the isolation insulating structure; and forming a slit structure in the slit, the slit structure being connected to the isolation insulating structure.

In yet another embodiment, a manufacturing method of a semiconductor device may include: forming a stack including first material layers and second material layers that are alternately stacked; forming an isolation insulating structure in a plane edge region of the stack, the isolation insulating structure including stacked insulating plates and insulating pillars extending through the insulating plates and extending in a first direction; forming a slit in a plane center region of the stack, the slit extending in the first direction and exposing the isolation insulating structure; replacing first material layers located in the plane center region among the first material layers with third material layers through the slit; and forming a slit structure in the slit.

BRIEF DESCRIPTION OF THE DRAWINGS

FIGS. 4A, 5A, 6A, 7A, 8A, 9A, and 10A and FIGS. 4B, 5B, 6B, 7B, 8B, 9B, and 10B are diagrams for describing a manufacturing method of a semiconductor device in accordance with various embodiments.

DETAILED DESCRIPTION

Various embodiments are directed to a semiconductor device having a stable structure and improved characteristics and a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical scope of the present disclosure will be described with reference to the accompanying drawings.

Figure 1A:
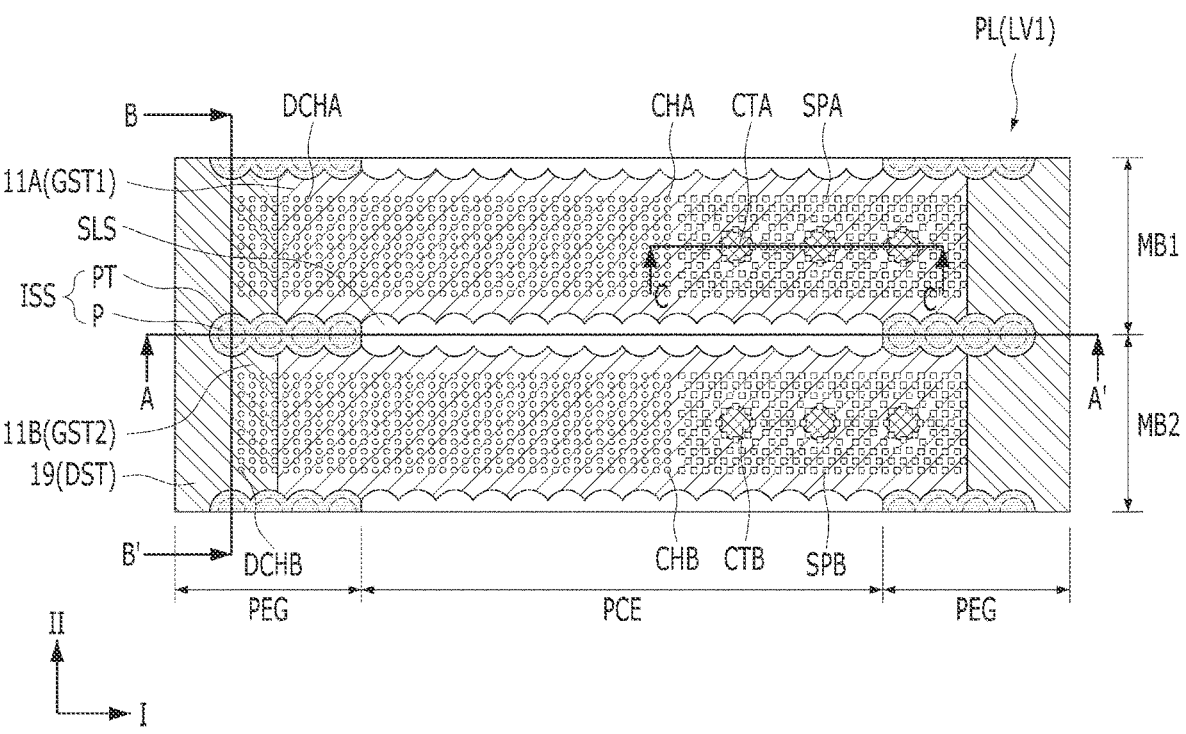
FIGS. 1A to 1E are diagrams illustrating the structure of a semiconductor device in accordance with one embodiment.
Figure 1B:
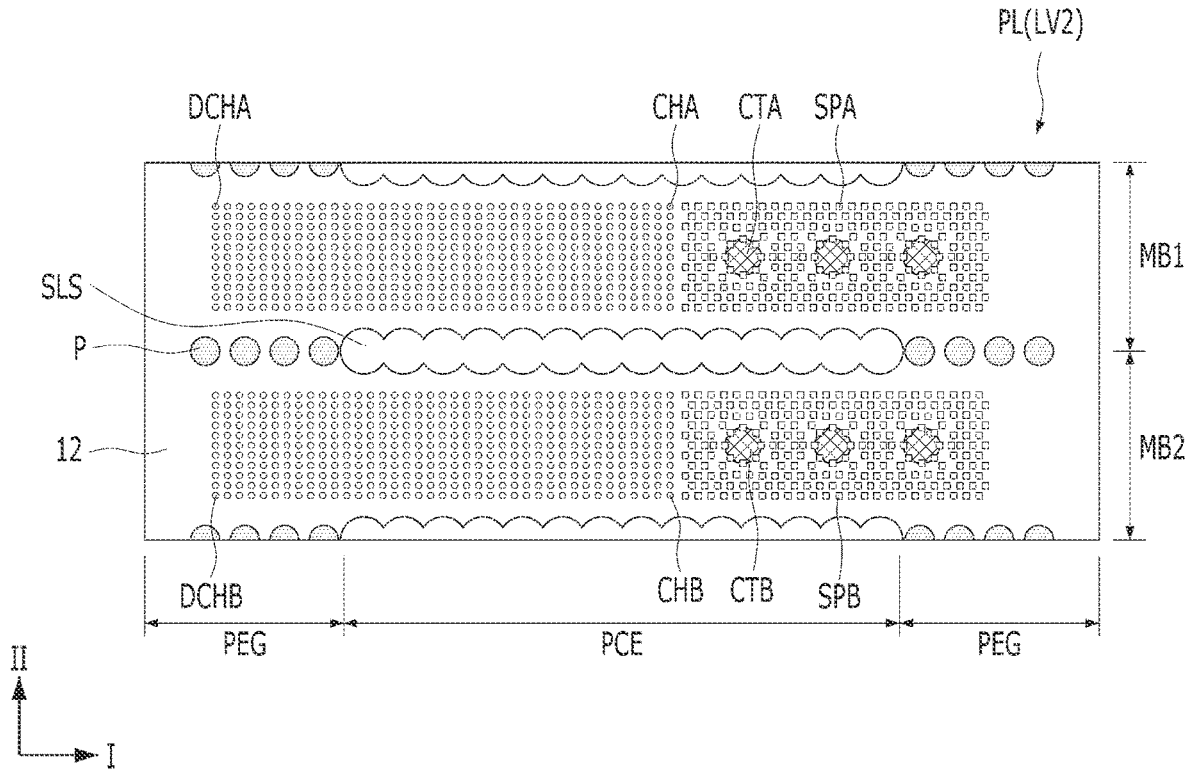
Figure 1C:
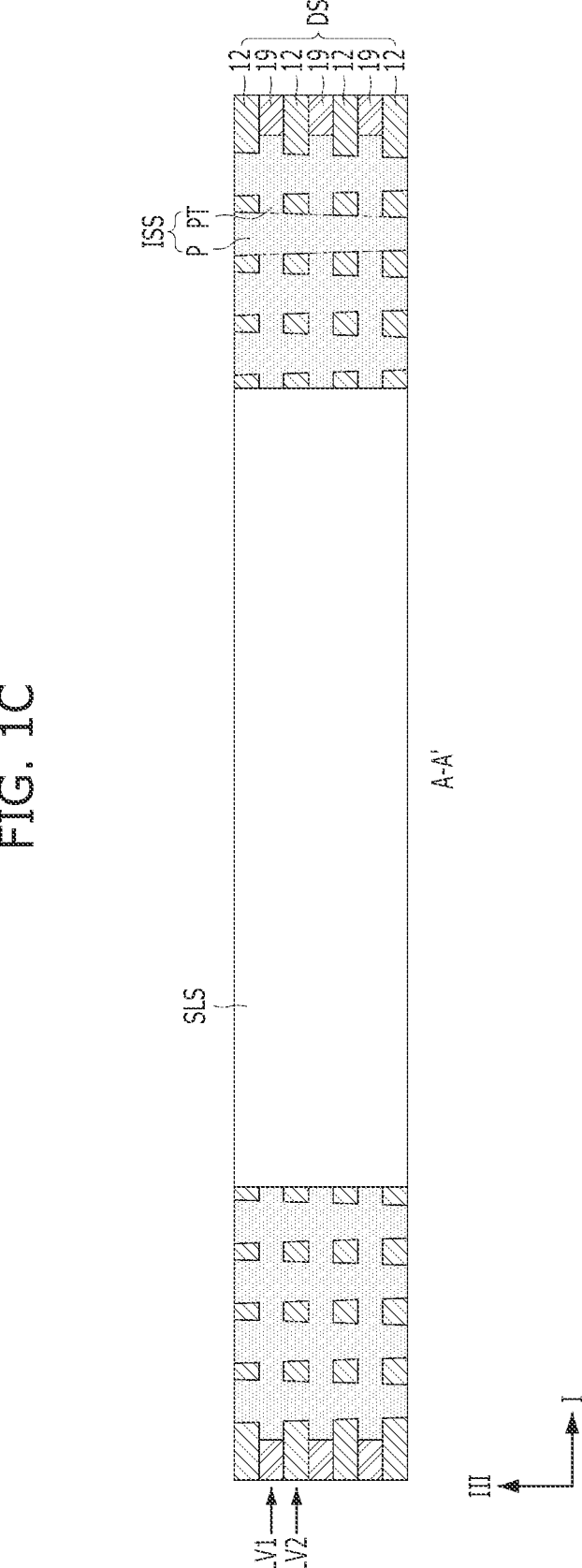
Figure 1D:
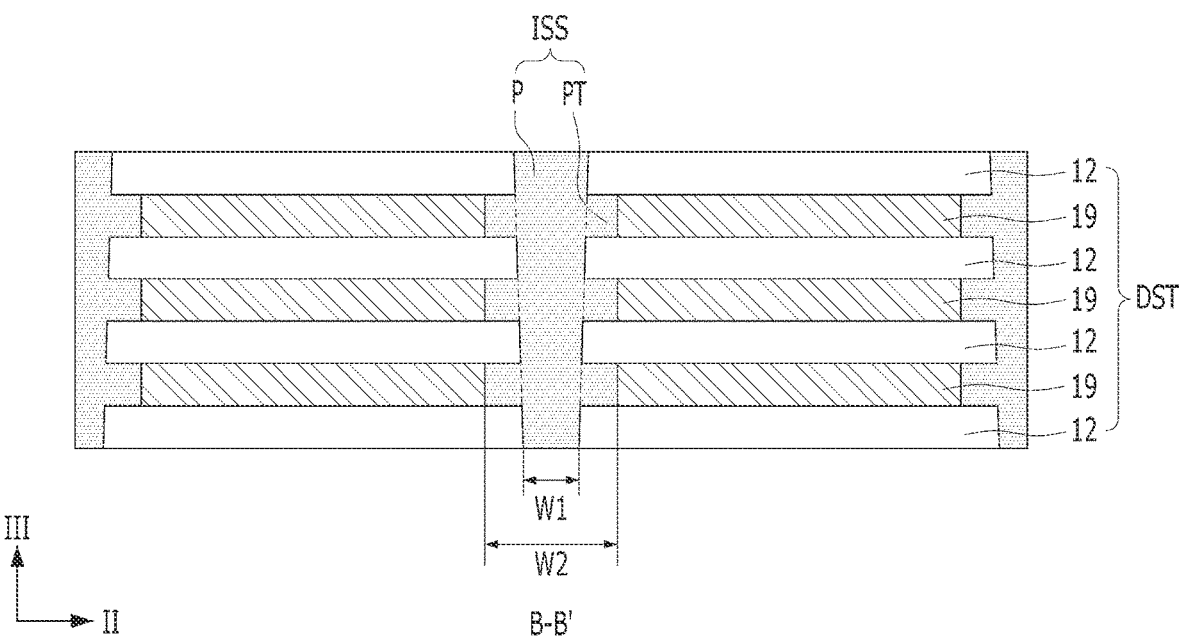
Figure 1E:
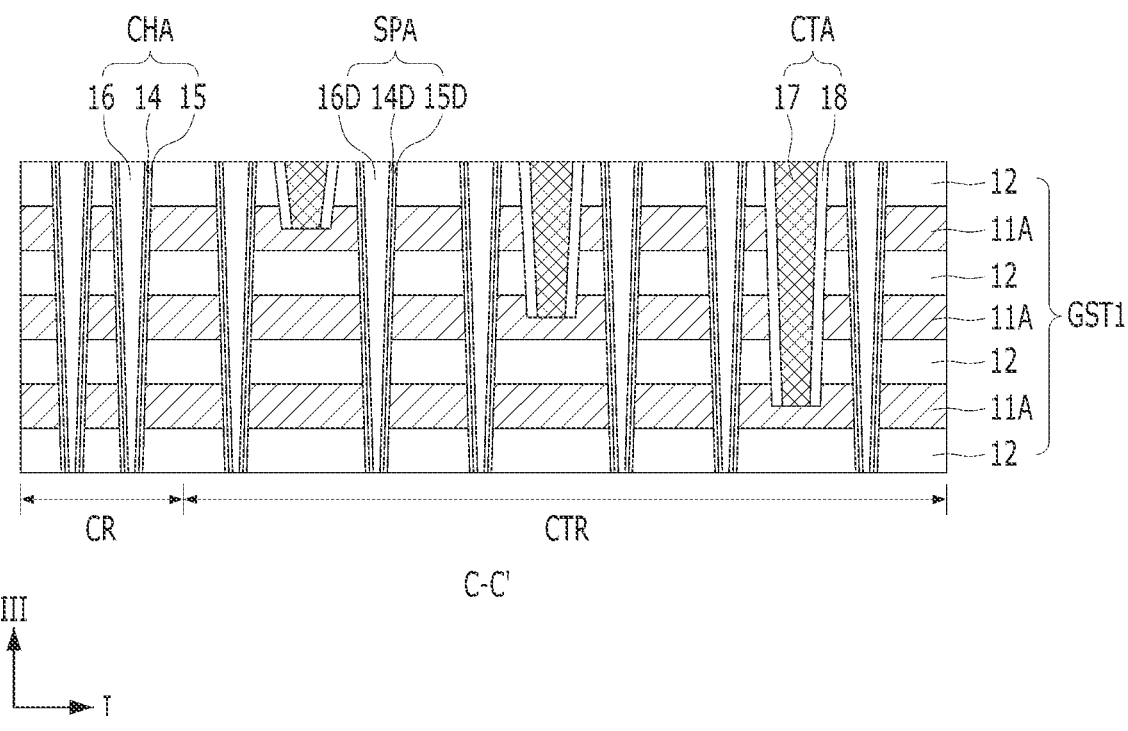

FIGS. 1A to 1E are diagrams illustrating the structure of a semiconductor device in accordance with one embodiment. FIG. 1A is a plan view of a first level LV1 of FIG. 1C, FIG. 1B is a plan view of a second level LV2 of FIG. 1C, FIG. 1C is a cross-sectional view taken along line A-A' of FIG. 1A, FIG. 1D is a cross-sectional view taken along line B-B' of FIG. 1A, and FIG. 1E is a cross-sectional view taken along line C-C' of FIG. 1A.

Referring to FIGS. 1A to 1E, the semiconductor device may include a plurality of memory planes PL. One die may include a plurality of memory planes PL, one memory plane PL may include a plurality of memory blocks MB1 and MB2, and one memory block MB1 or MB2 may include a plurality of pages. As an example, the memory block MB1 or MB2 may be a unit in which an erase operation is performed, and the page may be a unit in which a program and/or read operation is performed. Each memory plane PL may include a plane center region PCE and plane edge regions PEG. The plane center region PCE and the plane edge regions PEG may be adjacent to each other in a first direction I. As an example, the plane center region PCE may be located between a pair of plane edge regions PEG.

The semiconductor device may include at least one of a first gate structure GST1, a second gate structure GST2, a dummy stack DST, an isolation insulating structure ISS and a slit structure SLS, a first channel structure CHA, a second channel structure CHB, a first dummy channel structure DCHA, a second dummy channel structure DCHB, a first support SPA, a second support SPB, and a contact structure CT.

The first gate structure GST1 may include stacked first gate lines 11A. The first gate lines 11A and insulating layers 12 may be alternately stacked (as shown in FIG. 1E). The first gate lines 11A may be word lines, source select lines, drain select lines, and the like. The first gate lines 11A may each include a conductive material such as for example polysilicon or a metal. The first gate structure GST1 may belong to the first memory block MB1. The first gate structure GST1 may be located in the plane center region PCE of the memory plane PL, and may extend into the plane edge regions PEG.

The second gate structure GST2 may include stacked second gate lines 11B. The second gate lines 11B and insulating layers 12 may be alternately stacked. The second gate lines 11B may be word lines, source select lines, drain select lines, and the like. The second gate lines 11B may each include a conductive material such as for example polysilicon or a metal. The second gate structure GST2 may belong to the second memory block MB2. The second gate structure GST2 may be located in the plane center region PCE of the memory plane PL, and may extend into the plane edge regions PEG.

The first gate structure GST1 may extend in the first direction I, and the first gate lines 11A may extend in the first direction I. The second gate structure GST2 may extend in the first direction I, and the second gate lines 11B may extend in the first direction I. The first gate structure GST1 and the second gate structure GST2 may be adjacent to each other in a second direction II intersecting the first direction I.

The first memory block MB1 may include at least one of the first gate structure GST1, the first channel structure CHA, the first dummy channel structure DCHA, the first support SPA, and first contact structures CTA. The first gate structure GST1 may include a cell region CR and a contact region CTR (as shown in FIG. 1E). The cell region CR may be a region where memory cells are stacked, and the contact region CTR may be a region where an interconnection structure is located. The interconnection structure may include a contact plug, a wiring line, and the like, and may provide a path for transmitting a bias to the stacked memory cells.

Referring to FIG. 1E, the first channel structure CHA may extend through the cell region CR of the first gate structure GST1. The first channel structure CHA may include a channel layer 14, and may further include at least one of a memory layer 15 and/or an insulating core 16. The memory layer 15 may include at least one or more of a tunneling layer, a data storage layer, and a blocking layer. The data storage layer may include a floating gate, polysilicon, a charge trap material, nitride, a variable resistance layer, or the like. At least one or more of the first channel structures CHA may be the first dummy channel structure DCHA. Referring back to FIGS. 1A and 1B, the first dummy channel structure DCHA may be located in the plane edge region PEG, and may have a structure similar to that of the first channel structure CHA.

The first contact structures CTA may extend through the contact region CTR of the first gate structure GST1, and may be connected to the first gate lines 11A, respectively. The first contact structure CTA may include a first contact plug 17 and an insulating spacer 18 surrounding sidewalls of the first contact plug 17. For reference, it is also possible that the first gate structure GST1 includes step structures each exposing the first gate lines 11A and the first contact structures CTA are connected to the first gate lines 11A exposed through the step structures.

The first support SPA may extend through the contact region CTR of the first gate structure GST1. The first support SPA may be located around the first contact structure CTA. The first support SPA may have a structure similar to that of the first channel structure CHA or the first dummy channel structure DCHA. As an example, the first support SPA may include at least one of a dummy channel layer 14D, a dummy memory layer 15D, and a dummy insulating core 16D (as shown in FIG. 1E). The first supports SPA may be arranged in the first direction I and the second direction II or may be staggered in a zigzag shape. As an example, the first supports SPA may be arranged to surround the first contact structure CTA, and may protrude into the first contact structure CTA (as shown in FIGS. 1A and 1B).

The second memory block MB2 may have a structure similar to that of the first memory block MB1. The second memory block MB2 may include at least one of the second gate structure GST2, the second channel structure CHB, the second dummy channel structure DCHB, the second support SPB, and second contact structures CTB.

The isolation insulating structure ISS may be located inside the memory plane PL, and may be located between (or at a boundary between) the first memory block MB1 and the second memory block MB2 (as shown in FIGS. 1A and 1B). The isolation insulating structure ISS may be located between the first memory block MB1 and the second memory block MB2 in the plane edge region PEG. The isolation insulating structure ISS may extend in the first direction I.

The isolation insulating structure ISS may include stacked insulating plates PT and insulating pillars P (as shown in FIGS. 1C and 1D). The insulating plates PT may be located at levels corresponding to the first gate lines 11A and the second gate lines 11B. The insulating plates PT and insulating layers 12 may be alternately stacked. The insulating pillars P may extend in a third direction III through the insulating plates PT. Here, the third direction III may be a direction perpendicular to a plane defined by the first direction I and the second direction II.

The insulating plate PT may have a line shape in which it extends in the first direction I. The insulating pillars P may be arranged in the first direction, and may be spaced apart from each other. The insulating plates PT may extend in the first direction I, and the insulating pillars P may be connected to each other by the insulating plates PT. In the second direction II, the insulating pillar P may have a first width W1, and the insulating plate PT may have a second width W2 greater than the first width W1 (as shown in FIG. 1D).

In the plane edge region PEG, the insulating layers 12 may be stacked alternately with the insulating plates PT. The insulating layers 12 may extend in the second direction II, and may penetrate through the isolation insulating structure ISS between the insulating pillars P. The insulating layers 12 may extend between the stacked first gate lines 11A and between the stacked second gate lines 11B.

The slit structure SLS may be located inside the memory plane PL, and may be located between (or at a boundary between) the first memory block MB1 and the second memory block MB2. The slit structure SLS may be located between the first memory block MB1 and the second memory block MB2 in the plane center region PCE. The slit structure SLS may be connected to the isolation insulating structure ISS, and may be located between the first gate structure GST1 and the second gate structure GST2. The slit structure SLS may include at least one or more of an insulating material, a conductive material, and a semiconductor material. As an example, the slit structure SLS may include a gap fill material such as for example an insulating layer or a semiconductor layer. It is also possible that the slit structure SLS includes a source contact structure electrically connected to a source layer.

As shown in FIGS. 1A and 1B, the slit structure SLS may extend in the first direction I, and may include irregularities on sidewalls thereof. Irregularities as used herein means that the sidewall surfaces are intentionally shaped for example by patterning and/or etching to have an undulating or curved surface wall. The sidewalls of the slit structure SLS may include a convex portion and a concave portion. The isolation insulating structures ISS may be connected to both ends of the slit structure SLS. The first gate structure GST1 and the second gate structure GST2 may be electrically isolated from each other by the isolation insulating structure ISS and the slit structure SLS. The first memory block MB1 and the second memory block MB2 may be electrically isolated from each other by the isolation insulating structure ISS and the slit structure SLS.

As shown in FIGS. 1C and 1D, the dummy stack DST may include stacked sacrificial layers 19. The sacrificial layers 19 may be layers remaining without being replaced by the gate lines 11A and 11B in a manufacturing process. The dummy stack DST may include the sacrificial layers 19 and the insulating layers 12 that are alternately stacked. The dummy stack DST may be adjacent to the first gate structure GST1 and the second gate structure GST2 in the first direction I. At least one or more of the first dummy channel structure DCHA and the second dummy channel structure DCHB may extend through the dummy stack DST. A portion of the isolation insulating structure ISS may be located in the dummy stack DST, and the remaining portion of the isolation insulating structure ISS may be located between the first gate structure GST1 and the second gate structure GST2.

According to the structure described above, the first gate structure GST1 and the second gate structure GST2 may be electrically isolated from each other by the isolation insulating structure ISS and the slit structure SLS. The isolation insulating structure ISS may protrude into the dummy stack DST, and ends of the first gate structure GST1 and the second gate structure GST2 may be isolated from each other by the dummy stack DST and the isolation insulating structure ISS without a separate cutting structure. Through this configuration, the semiconductor device may be driven in units of memory blocks. The first gate structure GST1 and the second gate structure GST2 may be separately driven.

Figure 2A:
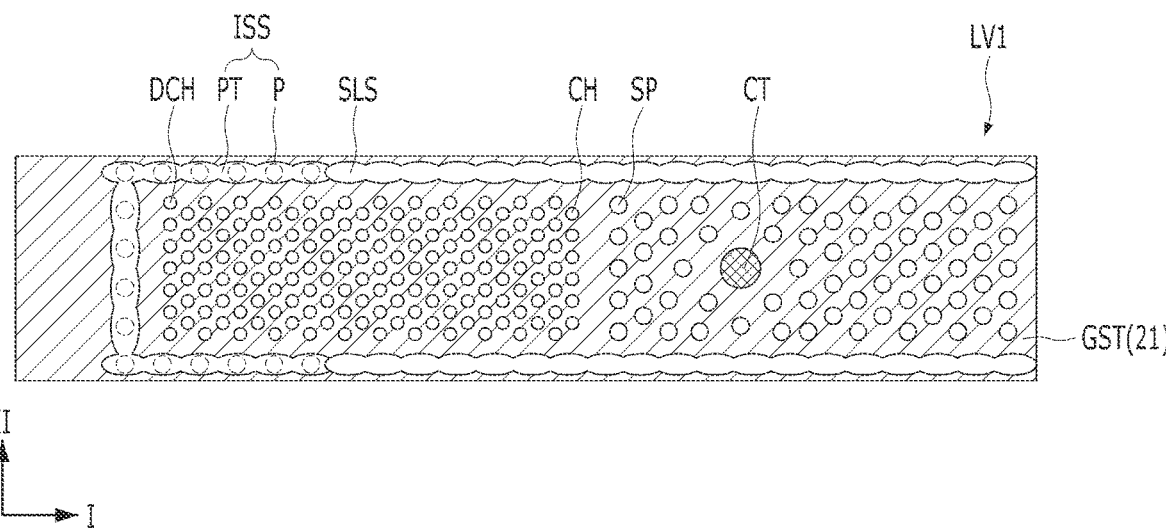
FIGS. 2A and 2B are diagrams illustrating the structure of a semiconductor device in accordance with another embodiment.
Figure 2B:
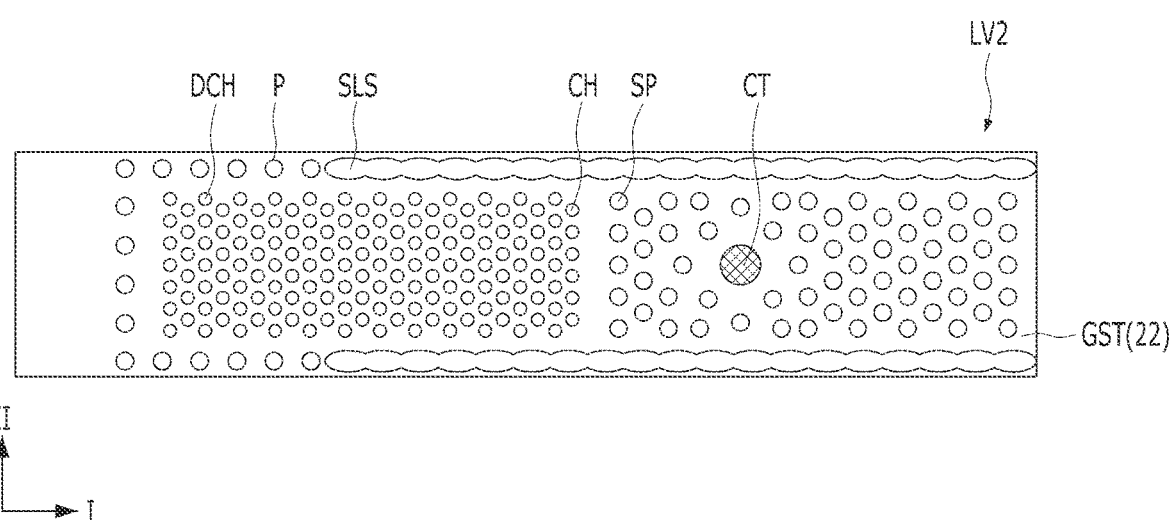

FIGS. 2A and 2B are diagrams illustrating the structure of a semiconductor device in accordance with another embodiment. Hereinafter, the content overlapping with the previously described content may be omitted.

Referring to FIGS. 2A and 2B, the semiconductor device may include at least one of a gate structure GST, a channel structure CH, a dummy channel structure DCH, a slit structure SLS, an isolation insulating structure ISS, a support SP, and a contact structure CT. The gate structure GST may include gate lines 21 and insulating layers 22 that are alternately stacked. FIG. 2A may be a plan view of the gate line 21, and FIG. 2B may be a plan view of the insulating layer 22.

The isolation insulating structure ISS may include stacked insulating plates PT and insulating pillars P. The insulating plate PT may be located at a level corresponding to the gate line 21. In the plane defined by the first direction I and the second direction II, the insulating plate PT may have a line shape in which it extends in a C shape surrounding dummy channel structures DCH. In a plan view, the insulating pillars P may be arranged in a C shape, and may be spaced apart from each other. The insulating pillars P may be connected to each other by the insulating plate PT. For reference, a dummy stack may be located around the isolation insulating structure ISS.

According to the structure described above, the gate structures GST adjacent to each other in the second direction II may be electrically isolated from each other by the isolation insulating structure ISS having a C shape.

Figure 3A:
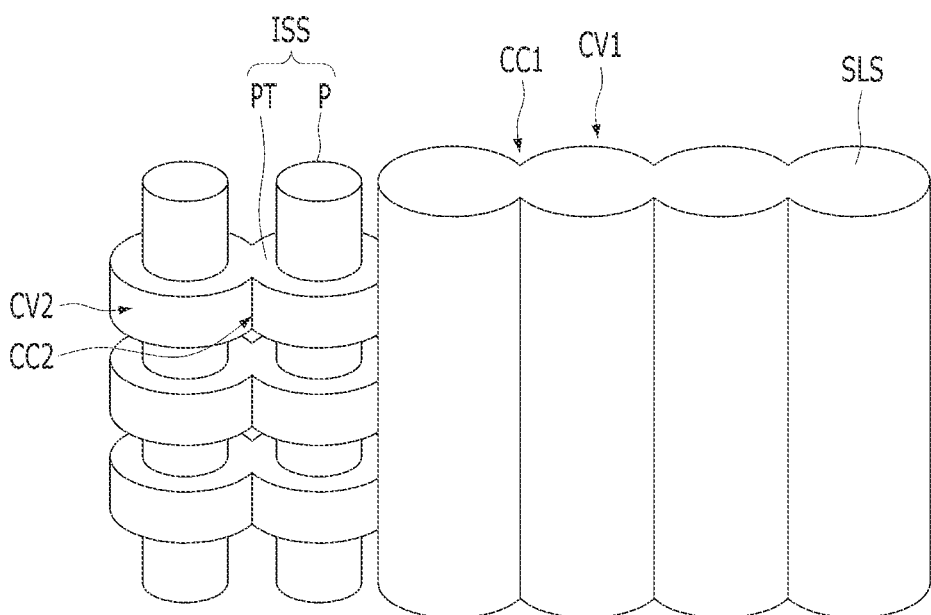
FIGS. 3A and 3B are diagrams illustrating the structure of a semiconductor device in accordance with still another embodiment.
Figure 3B:
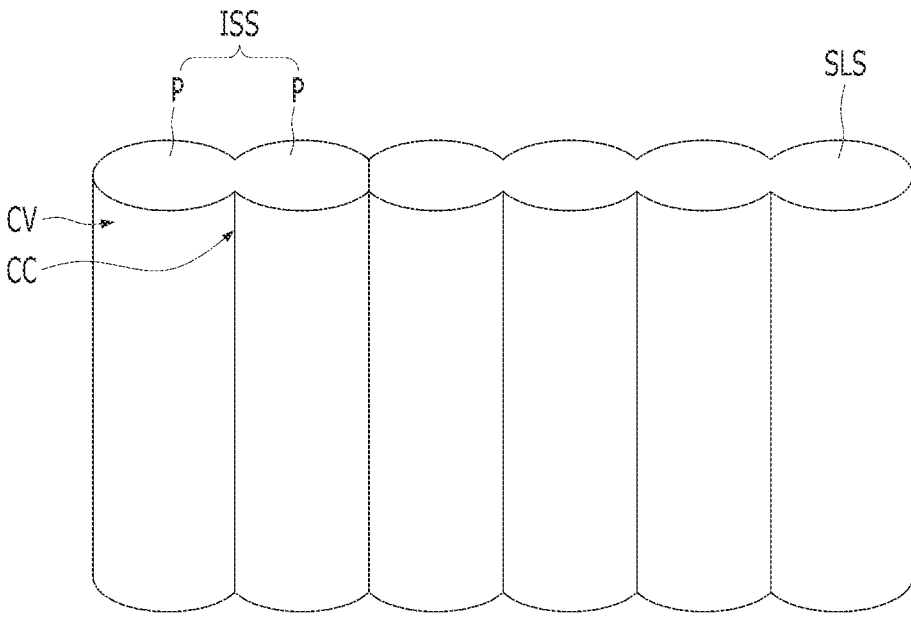

FIGS. 3A and 3B are diagrams illustrating the structure of a semiconductor device in accordance with yet another embodiment. Hereinafter, the content overlapping with the previously described content may be omitted.

Referring to FIG. 3A, the isolation insulating structure ISS and the slit structure SLS may be connected to each other, and may have different structures. The slit structure SLS may have a shape in which a plurality of pillars are connected to each other. The sidewalls of the slit structure SLS may include the above-noted irregularities. The sidewalls of the slit structure SLS may include first convex portions CV1 and first concave portions CC1. The first convex portions CV1 and the first concave portions CC1 may be alternately arranged.

The isolation insulating structure ISS may include the insulating pillars P and the insulating plates PT. Sidewalls of the insulating plate PT may include irregularities. The sidewalls of the insulating plate PT may include second convex portions CV2 and second concave portions CC2. The second convex portions CV2 and the second concave portions CC2 may be alternately arranged. In a plan view, the insulating pillar P may have a circular shape, an elliptical shape, a polygonal shape, or the like. The insulating pillar P may have a circular shape, and the insulating plate PT may have a shape in which circular shapes having a greater width than the insulating pillar P are connected to each other. The second convex portion CV2 may extend along a sidewall of the insulating pillar P, and the second concave portion CC2 may be located between adjacent insulating pillars.

Referring to FIG. 3B, the isolation insulating structure ISS and the slit structure SLS may be connected to each other, and may have similar structures. The slit structure SLS may have a shape in which a plurality of pillars are connected to each other, and may include irregularities on sidewalls thereof. The isolation insulating structure ISS might not include the insulating plates, and a plurality of insulating pillars P may be directly connected to each other. Sidewalls of the isolation insulating structure ISS may include convex portions CV and concave portions CC that are alternately arranged.

According to the structure described above, the isolation insulating structure ISS and the slit structure SLS may be connected to each other. The isolation insulating structure ISS and the slit structure SLS may have similar or different shapes. As an example, the isolation insulating structure may include the insulating plates PT, and the insulating plate PT may include the second convex portions CV2 and the second concave portions CC2 on the sidewalls thereof.

FIGS. 4A, 5A, 6A, 7A, 8A, 9A, and 10A and FIGS. 4B, 5B, 6B, 7B, 8B, 9B, and 10B are diagrams for describing a manufacturing method of a semiconductor device in accordance with various embodiments. FIGS. 4A, 5A, 6A, 7A, 8A, 9A, and 10A are plan views, and FIGS. 4B, 5B, 6B, 7B, 8B, 9B, and 10B are cross-sectional views taken along lines D-D' of FIGS. 4A, 5A, 6A, 7A, 8A, 9A, and 10A, respectively. Hereinafter, the content overlapping with the previously described content may be omitted.

Figure 4A:
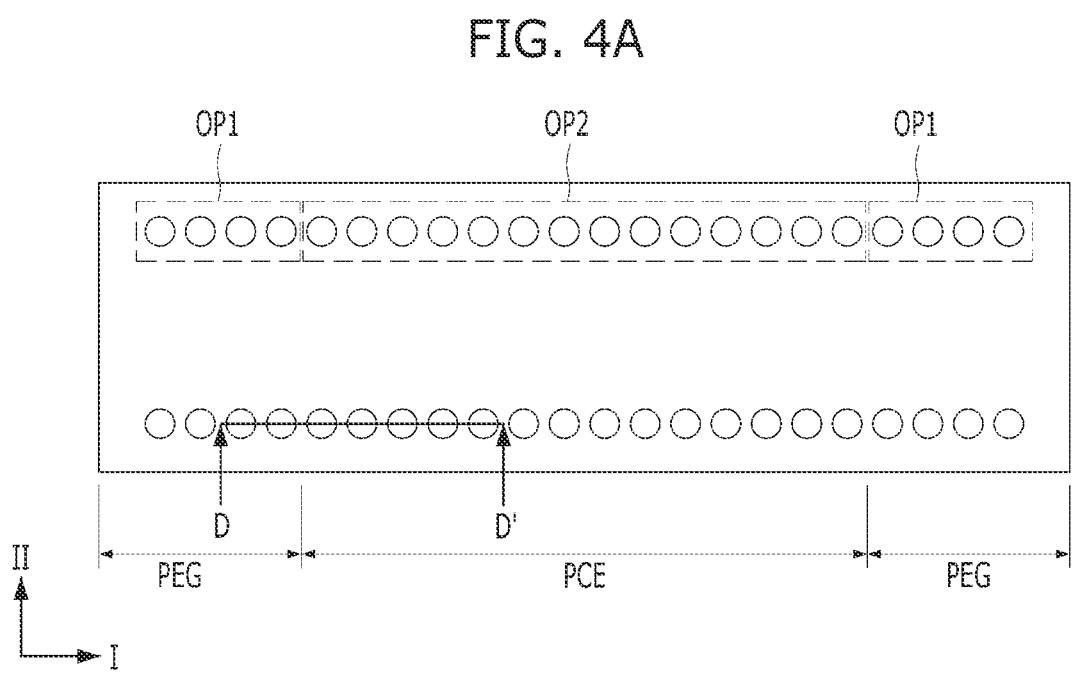
Figure 4B:
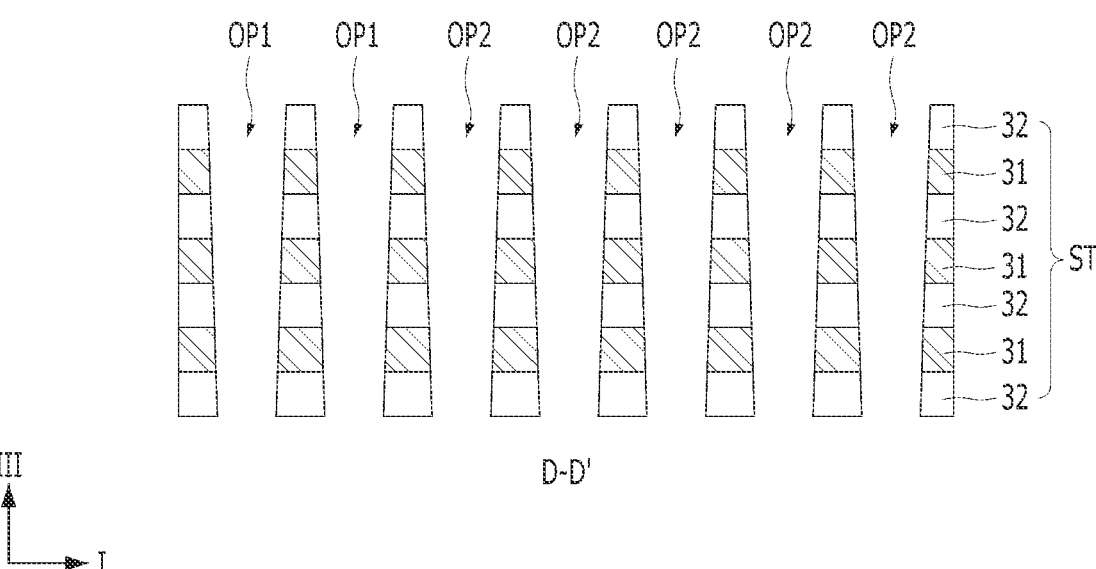

Referring to FIGS. 4A and 4B, a stack ST including first material layers 31 and second material layers 32 that are alternately stacked may be formed. The first material layers 31 may be used to form gate lines, and the second material layers 32 may be used to insulate the stacked gate lines from each other. The first material layers 31 may each include a material having a high etching selectivity with respect to the second material layers 32. As an example, the first material layers 31 may each include a sacrificial material such as for example a nitride or a conductive material such as for example polysilicon and/or metal. The second material layers 32 may each include an insulating material such as oxide or nitride.

The stack ST may include a plane center region PCE and plane edge regions PEG. The plane center region PCE and the plane edge regions PEG may be adjacent to each other in the first direction I. At least one or more of channel structures, dummy channel structures, supports, and contact structures may be formed in the plane center region PCE of the stack ST. The contact structures may be respectively connected to the first material layers 31 through the stack ST. For reference, it is also possible to form contact sacrificial structures and replace the contact sacrificial structures with the contact structures in a subsequent process. The dummy channel structures and the supports may support the stack ST and reduce bending of the stack ST, when the first material layers 31 are replaced with third material layers 31A in a subsequent process.

Subsequently, first openings OP1 may be formed in the plane edge regions PEG of the stack ST. In a plan view, the first opening OP1 may have a circular shape, an elliptical shape, a polygonal shape, or the like. Second openings OP2 may be formed in the plane center region PCE of the stack ST. In a plan view, the second opening OP2 may have one or more of a circular shape, an elliptical shape, a polygonal shape, or the like. The first openings OP1 and the second openings OP2 may have substantially the same shape or different shapes. As an example, the first openings OP1 and the second openings OP2 may have substantially the same width, and may be arranged at substantially the same intervals.

The first openings OP1 and the second openings OP2 may be arranged in the first direction I. The first openings OP1 and the second openings OP2 may be aligned in the first direction I. The first openings OP1 and the second openings OP2 may be located at a boundary between adjacent memory blocks. When the first openings OP1 are formed, the second openings OP2 may be formed. For reference, it is also possible to form the first openings OP1 and the second openings OP2 together with openings for forming the channel structures and/or the contact structures when the openings for forming the channel structures and/or the contact structures are formed.

Figure 5A:
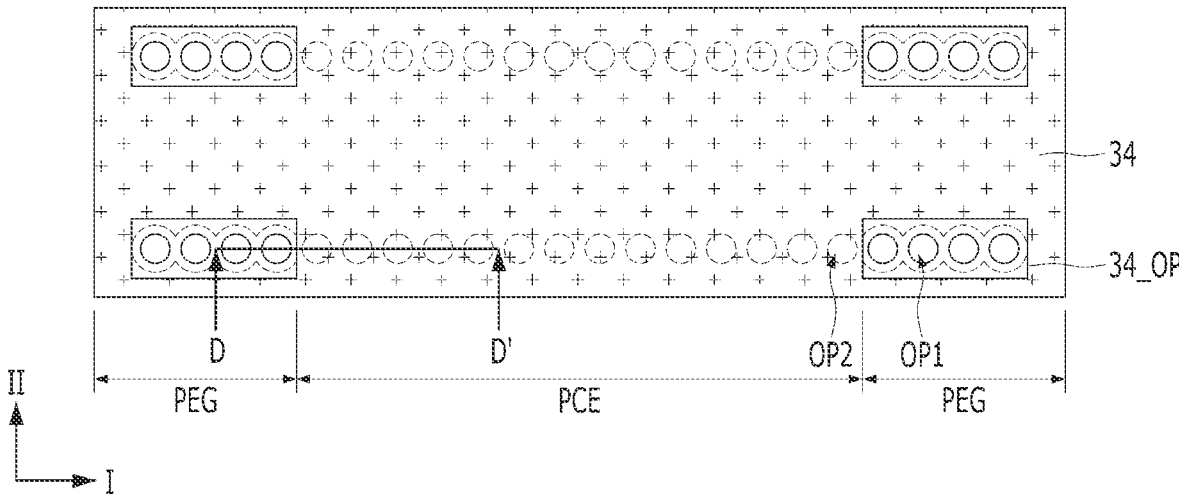
Figure 5B:
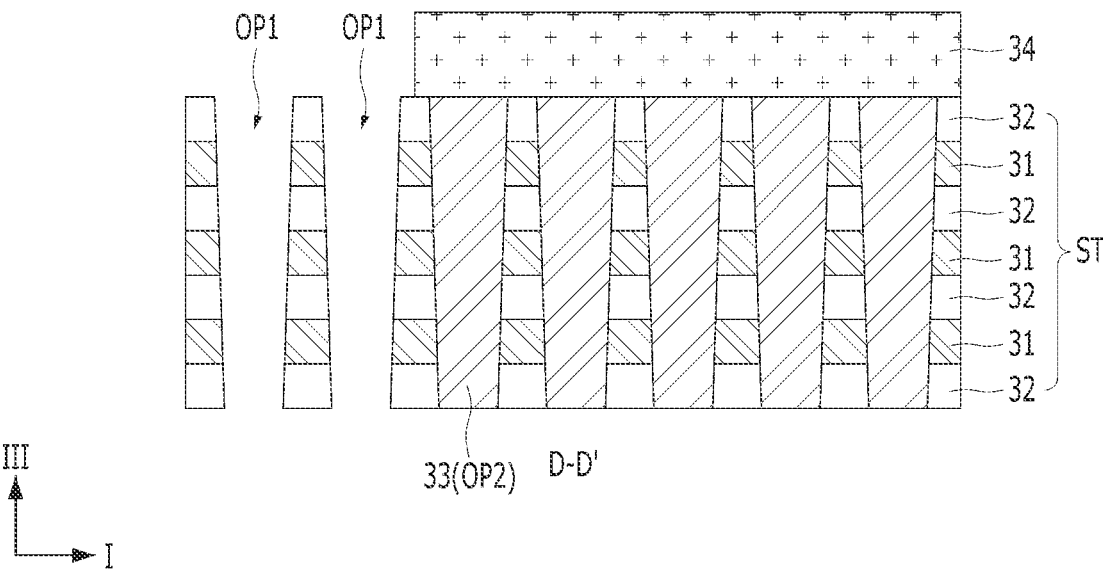

Referring to FIGS. 5A and 5B, a first mask pattern 34 may be formed on the stack ST. The first mask pattern 34 may include openings 34_OP partially exposing the plane edge regions PEG. The first mask pattern 34 may cover the second openings OP2 and may expose the first openings OP1.

For reference, before the first mask pattern 34 is formed, sacrificial layers 33 may be formed in the first openings OP1 and the second openings OP2. The sacrificial layers 33 may each include a material having a high etching selectivity with respect to the first material layers 31 and the second material layers 32. When the sacrificial layers 33 are formed, the first openings OP1 may be reopened by removing the sacrificial layers 33 in the first openings OP1 after forming the first mask pattern 34.

Figure 6A:
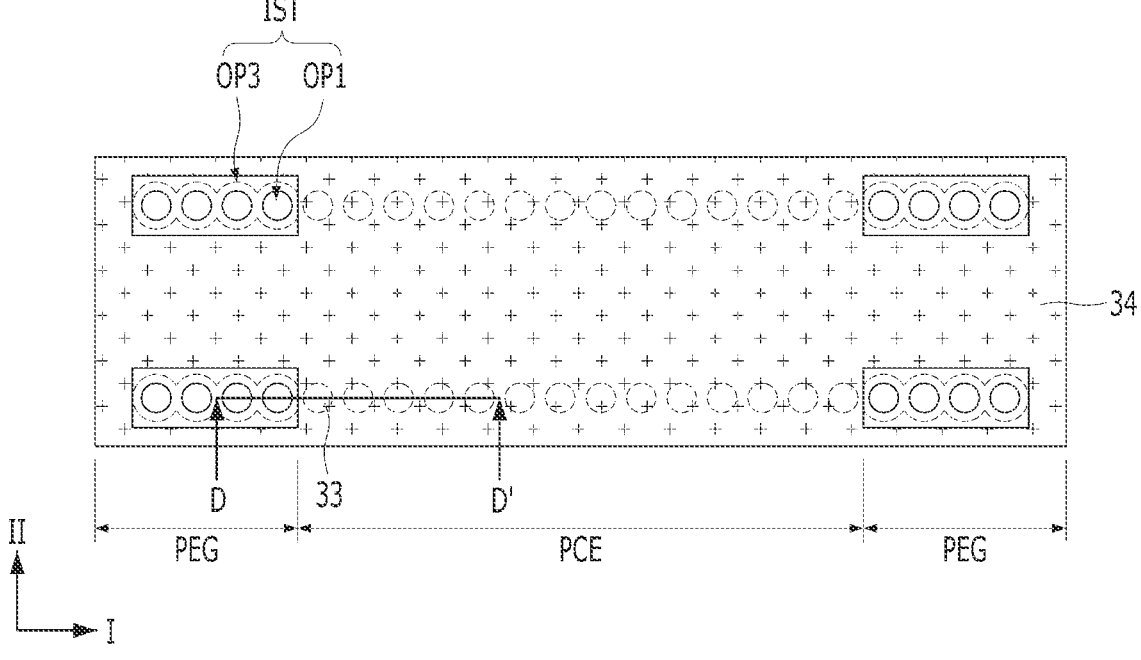
Figure 6B:
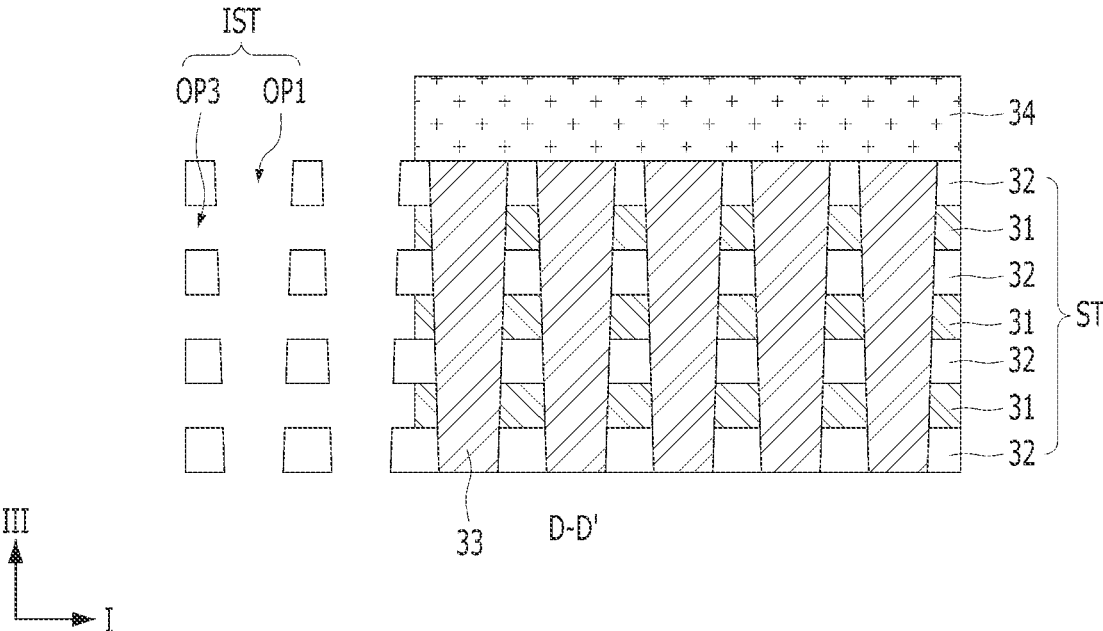

Referring to FIGS. 6A and 6B, an isolation trench IST may be formed by etching the first material layers 31 through the first openings OP1. Third openings OP3 may be formed by selectively etching the first material layers 31. The first openings OP1 may be connected to each other by the third openings OP3. The first openings OP1 may be expanded at some of the levels by etching the first material layers 31, and the expanded portions of the first openings OP1 may be connected to each other to form the third openings OP3. Through this, the first material layers 31 around the first openings OP1 in the plane edge region PEG may be removed in advance. The first material layers 31 located at a boundary between memory blocks in the plane edge region PEG may be removed in advance.

When the first openings OP1 are expanded, the shapes of the first openings OP1 may be transferred to the third openings OP3. As an example, when the first openings OP1 have a circular shape, curved surfaces of the first openings OP1 may be transferred to the third openings OP3. Accordingly, sidewalls of the third opening OP3 may include irregularities. As an example, the sidewalls of the third opening OP3 may include for example a convex portion and a concave portion (such as those described above). Through this, the isolation trench IST including the first openings OP1 and the third openings OP3 may be formed. The isolation trench IST may be located at the boundary between the memory blocks.

Figure 7A:
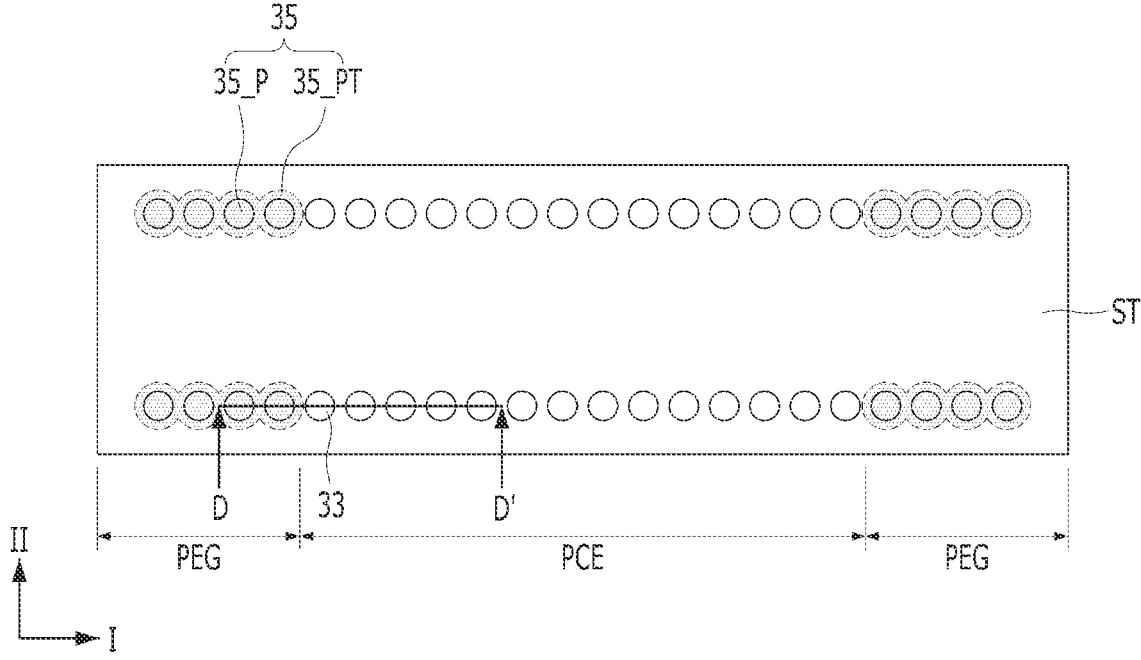
Figure 7B:
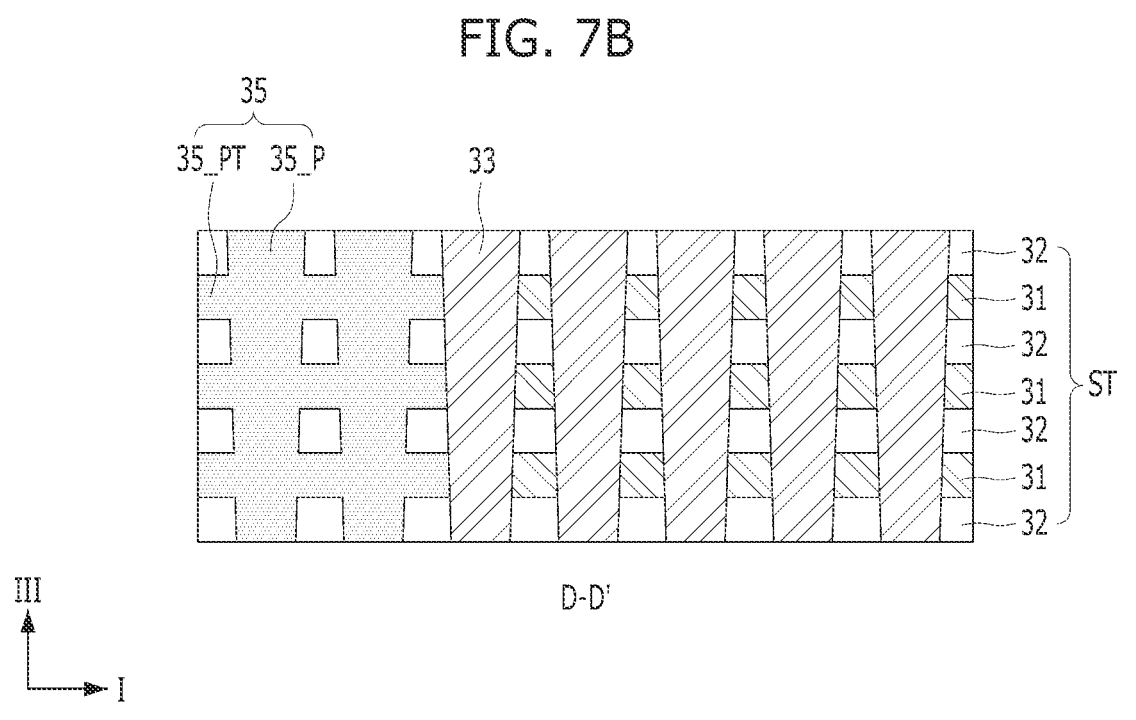

Referring to FIGS. 7A and 7B, an isolation insulating structure 35 may be formed in the isolation trench IST. The isolation insulating structure 35 may be formed by a thermal atomic layer deposition (ALD) method, a low pressure chemical vapor deposition (LP-CVD) method, or the like. The isolation insulating structure 35 may include an insulating material such as for example an oxide, a nitride, and/or air gap. Through this, the first material layers 31 around the first openings OP1 in the plane edge region PEG may be replaced with the insulating material. The first material layers 31 located at the boundary between the memory blocks in the plane edge region PEG may be replaced with the insulating material.

The isolation insulating structure 35 may include stacked insulating plates 35_PT and insulating pillars 35_P extending in the third direction III through the insulating plates 35_PT. The insulating pillars 35_P may be located in the first openings OP1, and the insulating plates 35_PT may be located in the third openings OP3. The insulating pillars 35_P and the insulating plates 35_PT may be connected to each other as one layer. The insulating plate 35_PT may include irregularities on sidewalls thereof, and may include for example a convex portion and a concave portion.

For reference, the second material layers 32 may be selectively etched before the isolation insulating structure 35 is formed. In such a case, the isolation insulating structure ISS described above with reference to FIG. 3B may be formed.

Referring to FIGS. 8A, 8B, 9A, and 9B, the second openings OP2 may be expanded to form a slit SL. The second openings OP2 may be expanded so that the second openings OP2 are connected to each other, and the isolation insulating structure 35 may be exposed through the slit SL extending in the first direction I. As an example, the isolation insulating structures 35 may be exposed at both ends of the slit SL. The slit SL may be located at the boundary between the memory blocks.

Figure 8A:
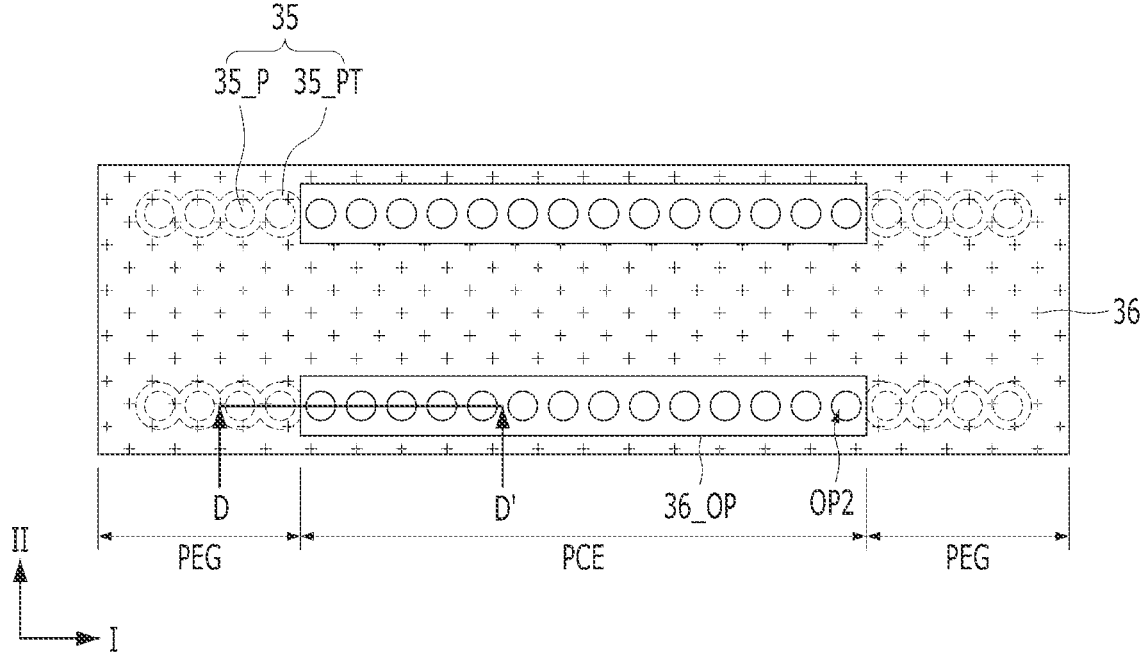
Figure 8B:
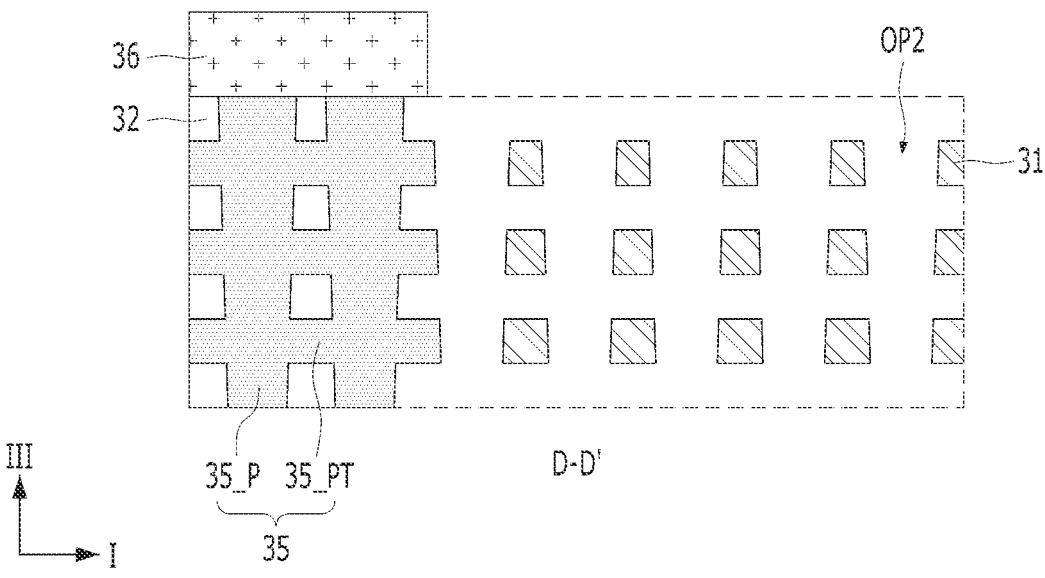

First, referring to FIGS. 8A and 8B, a second mask pattern 36 may be formed on the stack ST. The second mask pattern 36 may include openings 36_OP partially exposing the plane center region PCE. The second mask pattern 36 may cover the isolation insulating structure 35 and may expose the second openings OP2. Subsequently, the second openings OP2 may be reopened by removing the sacrificial layers 33 in the second openings OP2. Subsequently, the second material layers 32 may be etched through the second openings OP2. Sidewalls of the isolation insulating structure 35 may be exposed by selectively etching the second material layers 32. The insulating pillars 35_P of the isolation insulating structure 35 may be exposed.

Figure 9A:
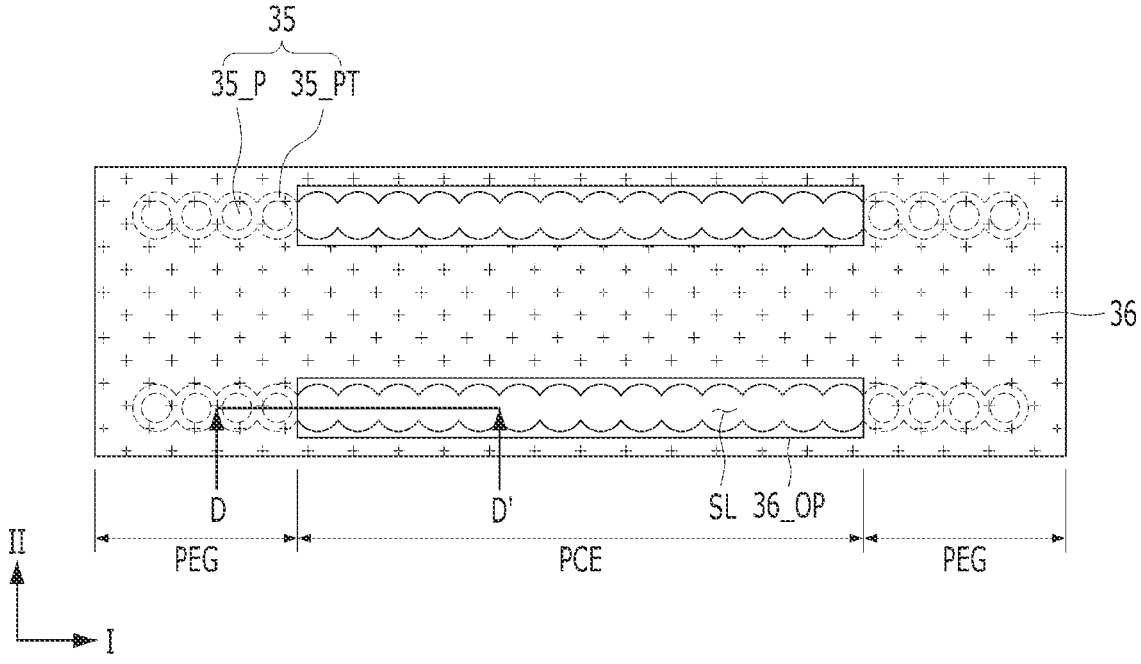
Figure 9B:
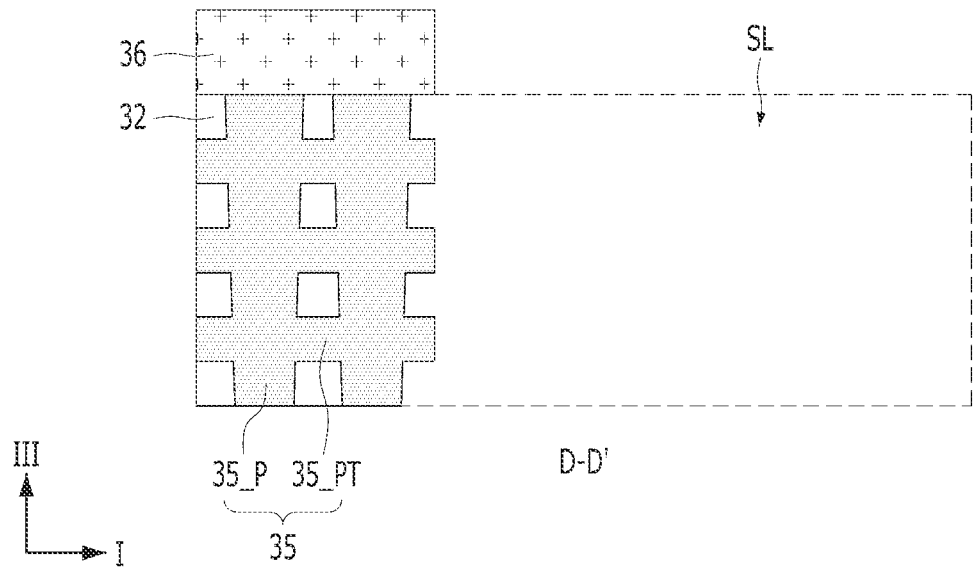

Subsequently, referring to FIGS. 9A and 9B, the first material layers 31 may be etched through the second openings OP2. Sidewalls of the isolation insulating structure 35 may be exposed by selectively etching the first material layers 31. The insulating plates 35_PT of the isolation insulating structure 35 may be exposed. Through this, the second openings OP2 may be expanded, and may be connected to each other. When the second openings OP2 are expanded, the shapes of the second openings OP2 may be transferred to the slit SL. As an example, when the second openings OP2 have a circular shape, curved surfaces of the second openings OP2 may be transferred to the slit SL. Accordingly, sidewalls of the slit SL may include irregularities. As an example, the sidewalls of the slit SL may include for example a convex portion and a concave portion.

For reference, the order or method of etching the first material layers 31 and the second material layers 32 may be changed. As an example, the second material layers 32 may be etched after the first material layers 31 are etched or the first material layers 31 and the second material layers 32 may be etched simultaneously.

Figure 10A:
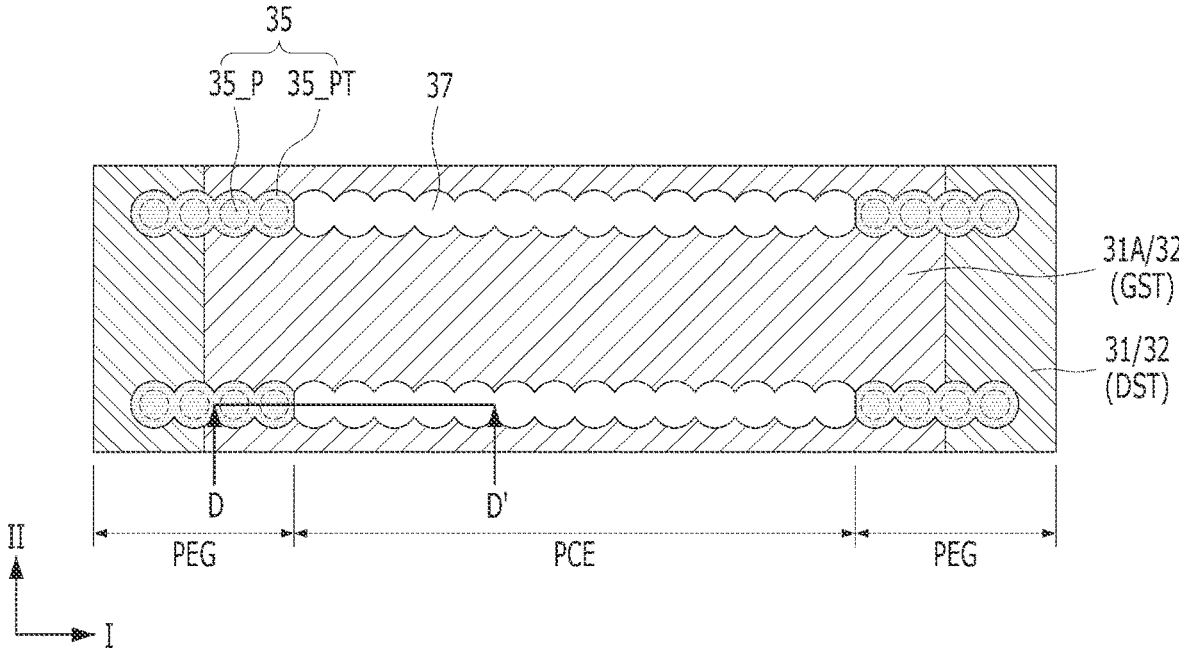
Figure 10B:
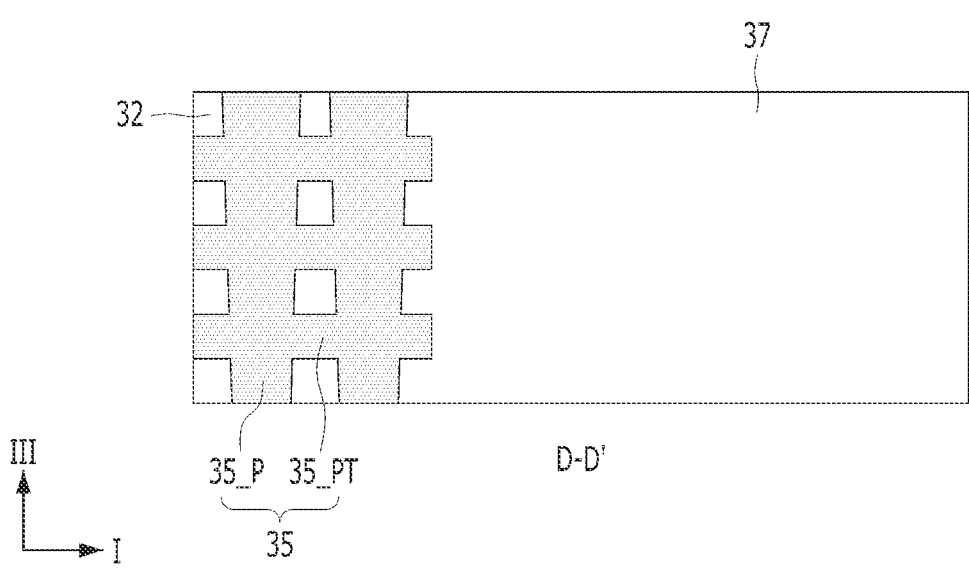

Referring to FIGS. 10A and 10B, the first material layers 31 may be replaced with the third material layers 31A through the slit SL. First, openings may be formed by selectively etching the first material layers 31 through the slit SL. Subsequently, a third material may be deposited in the openings through the slit SL. Subsequently, the third material deposited in the slit SL may be etched in a wet or dry manner to form the third material layers 31A respectively located in the openings. The third material layers 31A may each include metal such as tungsten or molybdenum. Through this, a gate structure GST including the third material layers 31A and the second material layers 32 that are alternately stacked may be formed.

When the first material layers 31 are etched, an etchant may be introduced through the slit SL, and the first material layers 31 in a predetermined range from the slit SL may be etched. Because the slit SL is located in the plane center region PCE, the first material layers 31 in the plane center region PCE may be replaced with the third material layers 31A. Because the slit SL is not located in the plane edge region PEG, only the first material layers 31 in a region close to the slit SL in the plane edge region PEG may be replaced with the third material layers 31A, and the first material layers 31 in the remaining region may remain as they are. Accordingly, the first material layers 31 may remain in the plane edge region PEG, and a region where the first material layers 31 remain may be defined as the dummy stack DST. The dummy stack DST may include the first material layers 31 and the second material layers 32 that are alternately stacked, and may partially surround the isolation insulating structures 35.

In addition, because the first material layers 31 formed at the boundary between the memory blocks are replaced with the insulating material in a process of forming the isolation insulating structure 35, the third material layers 31A might not be formed at the boundary between the memory blocks in the plane edge region PEG.

Subsequently, a slit structure 37 may be formed in the slit SL. As an example, the slit structure 37 may be formed by forming an insulating layer, a semiconductor layer and/or a conductive layer in the slit SL. Sidewalls of the slit structure 37 may include irregularities, and may include for example a convex portion and a concave portion. For reference, it is also possible that the slit structure 37 includes a source contact structure connected to a source layer.

According to the manufacturing method described above, the gate structures GST may be electrically isolated from each other by the isolation insulating structure 35, the slit structure 37, and the dummy stack DST. Because the isolation insulating structure 35 is formed in the plane edge region PEG and the slit SL is formed in the plane center region PCE, the dummy stack DST may be formed in the plane edge region PEG. Because the dummy stack DST is formed in the process of replacing the first material layers 31 with the third material layers 31A, even though the stack ST is not cut in the plane edge region PEG, the gate structures GST may be electrically isolated from each other.

Although embodiments according to the technical scope of the present disclosure have been described above with reference to the accompanying drawings, this is only for explaining the embodiments according to the present disclosure, and the present disclosure is not limited to the above embodiments. Various types of substitutions, modifications, and changes for the embodiments may be made by those skilled in the art, to which the present disclosure pertains, without departing from the technical scope of the present disclosure, and it should be construed that these substitutions, modifications, and changes belong to the scope of the present disclosure.

What is claimed is:

1. A semiconductor device comprising:
a first gate structure in a first memory block and including stacked first gate lines, the first gate lines extending from a plane center region to a plane edge region;
a second gate structure in a second memory block adjacent to the first memory block and including stacked second gate lines, the second gate lines extending from the plane center region to the plane edge region;
an isolation insulating structure located a) between the first gate structure and the second gate structure and b) in the plane edge region, the isolation insulating structure including insulating pillars arranged in a first direction and insulating plates which are stacked and connecting the insulating pillars; and a slit structure located a) between the first gate structure and the second gate structure and b) in the plane center region, the slit structure connected to the isolation insulating structure, and including irregularities on a sidewall thereof.

2. The semiconductor device of claim 1, wherein the plane edge region and the plane center region are adjacent to each other in the first direction, and the first gate lines and the second gate lines extend in the first direction.

3. The semiconductor device of claim 1, wherein the insulating plates extend in the first direction.

4. The semiconductor device of claim 1, wherein the insulating plates have a greater width than the insulating pillars in a second direction intersecting the first direction.

5. The semiconductor device of claim 1, further comprising insulating layers located in the plane edge region and stacked alternately with the insulating plates.

6. The semiconductor device of claim 5, wherein the insulating layers extend between the stacked first gate lines and between the stacked second gate lines.

7. The semiconductor device of claim 1, wherein the sidewall of the slit structure includes a convex portion and a concave portion.

8. The semiconductor device of claim 1, wherein a sidewall of each of the insulating plates includes a convex portion and a concave portion.

9. The semiconductor device of claim 1, wherein the first gate structure and the second gate structure are electrically isolated from each other by the isolation insulating structure and the slit structure.

10. The semiconductor device of claim 1, further comprising:

a first channel structure extending through the first gate structure; and first contact structures extending through the first gate structure and connected to the first gate lines, respectively.

11. A semiconductor device comprising:

a dummy stack including sacrificial layers and insulating layers that are alternately stacked;

a first gate structure adjacent to the dummy stack in a first direction and including stacked first gate lines;

a second gate structure adjacent to the dummy stack in the first direction and including stacked second gate lines;

first contact structures extending through the first gate structure and connected to the first gate lines, respectively;

second contact structures extending through the second gate structure and connected to the second gate lines, respectively;

a slit structure extending between the first gate structure and the second gate structure; and an isolation insulating structure connected to the slit structure and extending between the first gate structure and the second gate structure to protrude into the dummy stack.

12. The semiconductor device of claim 11, wherein the first gate structure and the second gate structure are adjacent to each other in a second direction intersecting the first direction, and the slit structure and the isolation insulating structure extend in the first direction.

13. The semiconductor device of claim 11, wherein the first gate structure and the second gate structure are electrically isolated from each other by the slit structure, the isolation insulating structure, and the dummy stack.

14. The semiconductor device of claim 11, wherein the insulating layers extend between the stacked first gate lines and between the stacked second gate lines.

15. The semiconductor device of claim 11, wherein the isolation insulating structure comprises:

stacked insulating plates; and insulating pillars extending through the stacked insulating plates.

16. The semiconductor device of claim 15, wherein the insulating layers extend between the insulating pillars.

17. The semiconductor device of claim 15, wherein a sidewall of each of the insulating plates includes irregularities.

18. The semiconductor device of claim 11, wherein a sidewall of the slit structure includes irregularities.

19. The semiconductor device of claim 1, wherein:

the first gate structure includes a cell region and a contact region, and the cell region and the contact region are disposed at the plane center region.

20. The semiconductor device of claim 1, further comprising:

a dummy stack including sacrificial layers and insulating layers that are alternately stacked, wherein the dummy stack is adjacent to the first gate structure and the second gate structure in a first direction, and wherein the isolation insulating structure protrudes into the dummy stack.

* * * * *